US006762590B2

(12) United States Patent
Yudahira

(10) Patent No.: US 6,762,590 B2
(45) Date of Patent: Jul. 13, 2004

(54) BATTERY POWER SOURCE DEVICE AND CURRENT DETECTION METHOD THEREFOR

(75) Inventor: Hirofumi Yudahira, Shizuoka (JP)

(73) Assignee: Panasonic EV Energy Co., Ltd., Shizuoka (JP)

( * ) Notice: Subject to any disclaimer, the term of this patent is extended or adjusted under 35 U.S.C. 154(b) by 0 days.

(21) Appl. No.: 10/303,894

(22) Filed: Nov. 26, 2002

(65) Prior Publication Data

US 2003/0102871 A1 Jun. 5, 2003

(30) Foreign Application Priority Data

Nov. 30, 2000 (JP) ........................................ 2001-365941

(51) Int. Cl.[7] ................................................ H02J 7/00
(52) U.S. Cl. ..................................................... 320/135
(58) Field of Search ................................ 320/104, 124, 320/125, 127, 129, 135, 141, 145, 149, 166, 139

(56) References Cited

U.S. PATENT DOCUMENTS 6,522,148 B2 * 2/2003 Ochiai et al. ................ 324/428
6,573,688 B2 * 6/2003 Nakanishi .................... 320/135
6,608,468 B2 * 8/2003 Nagase ........................ 320/132

* cited by examiner

*Primary Examiner*—Pia Tibbits
(74) *Attorney, Agent, or Firm*—Greenblum & Bernstein, P.L.C.

(57) ABSTRACT

A plurality of battery pack blocks connected in series-parallel have their operation states monitored by battery ECUs, respectively based on detected voltage, current, and temperature. Detection outputs by current sensors provided at the charge/discharge circuits of the battery pack blocks are added up for the parallel-connected battery pack blocks in an analog data state before A/D conversion, so that the total charge/discharge current in the battery power source device is obtained.

5 Claims, 4 Drawing Sheets

BATTERY POWER SOURCE DEVICE AND CURRENT DETECTION METHOD THEREFOR

The present disclosure relates to subject matter contained in priority Japanese Patent Application No. 2001-365941, filed on Nov. 30, 2001, the contents of which is herein expressly incorporated by reference in its entirety.

BACKGROUND OF THE INVENTION

1. Field of the Invention

The present invention relates to a battery power source device including a plurality of battery pack blocks, each of which is constituted by connecting a plurality of rechargeable batteries in series, and battery ECUs for controlling the operation state of the battery pack blocks. The plurality of battery pack blocks are connected with one another in parallel or by a combination of serial connection and parallel connection (in series-parallel). The invention also relates to a current detection method therefor.

2. Description of Related Art

A battery power source device applied as a power source for an electric vehicle or hybrid car must supply large electric power. The device is therefore configured as a battery pack system. In the system, a plurality of (six for example) rechargeable batteries are connected together in series to constitute a battery module, and a plurality of (30 for example) such battery modules are connected together in series to constitute a battery pack block. A battery ECU (Electronic Control Unit) is also provided in order to control the operation state of the battery pack block. The battery ECU detects the voltage, current, and temperature of each battery pack block and carry out abnormality detection and various control based on the detection results. To meet a demand for significantly large power for a large-sized vehicle, for example, connecting such battery pack systems together in series, parallel or in series-parallel has been considered.

FIG. 3 is a diagram showing the configuration of a battery power source device having six battery pack systems connected together in series-parallel. The battery pack systems all have the same arrangement including a battery pack block 21 and a battery ECU 22. The battery pack blocks 21 connected in series-parallel are each connected with a positive electrode charge/discharge terminal 23 and a negative electrode charge/discharge terminal 24. The operation state of each of the battery pack blocks 21 is monitored and controlled by the corresponding battery ECU 22.

The battery pack block 21 is provided with sensors to detect voltage per battery module, charge/discharge current to/from the battery pack block 21, battery temperature per battery module, and the ambient temperature of the battery pack block 21, and the detection outputs of the sensors are input to the corresponding battery ECU 22. The battery ECU 22 monitors the operation state or abnormality of the battery pack block 21 based on the input voltage, current, and temperature detection outputs. Meanwhile, the battery ECU 22 controls a cooling device such as a blower fan provided at the battery pack block 21 based on the temperature detection output. The battery ECU 22 also calculates SOC (State Of Charge: accumulated electrical quantity relative to battery capacity) based on the voltage, current, and temperature detection outputs. The SOC and the detection output such as voltage are externally output as the operation state data of the battery pack block 21, so as to be input to a vehicle ECU in a hybrid car for example and used for controlling charge/discharge to/from the battery power source device.

For example in a hybrid car using the battery power source device having a plurality of battery pack blocks connected in series-parallel as described above as the power source, there is a request that the total charge/discharge current I in the battery power source device be known.

The total charge/discharge current I can be detected by a special current sensor for high current provided at a charge/discharge circuit connected with the positive electrode charge/discharge terminal 23 or the negative electrode charge/discharge terminal 24 of the battery power source device. However, not only the expensive current sensor is necessary, but also a processing circuit for processing and amplifying the detection output of the current sensor is necessary, which increases the cost.

Meanwhile, the battery pack blocks 21 are each provided with a current sensor 25, and the charge/discharge current is separately detected for each battery pack block 21 by the corresponding battery ECU 22. Consequently, when the charge/discharge current values at the battery pack blocks 21 connected in parallel are added up, the total charge/discharge current I should be produced. However, the detected current is used to calculate the SOC as described above. Thus, as shown in FIG. 4, once the current is input to the battery ECU 22, it is amplified by an amplification circuit 16, then A/D-converted by an A/D conversion circuit 17, and input to a microcomputer 18 for digital processing. The A/D-converted current data cannot be in synchronization with each other among the battery pack systems A1 to A6, and it is therefore impossible to produce the total charge/discharge current I simply by adding them up.

SUMMARY OF THE INVENTION

It is an object of the present invention to provide a battery power source device that allows the total charge/discharge current to be obtained using the current detection function provided at each of a plurality of battery pack blocks, and a current detection method therefor.

In order to achieve the above object, a first aspect of the present invention is directed to a method for detecting a total charge/discharge current in a battery power source device. The battery power source device includes a plurality of battery pack systems connected in parallel or series-parallel. Each of the battery pack systems includes: a battery pack block having a plurality of rechargeable batteries connected in series; a battery ECU that detects a current, a voltage, and a temperature and controls an operation state of the battery pack block based on the detection result; and a charge/discharge circuit for connecting the battery pack block. The method for detecting a total charge/discharge current includes: detecting currents at the respective charge/discharge circuits of the battery pack systems detected by the corresponding battery ECUs provided at the battery pack systems connected in parallel; and adding up the currents in an analog data state.

According to the current detection method, the total charge/discharge current in the battery power source device is obtained without having to provide current detection means and a processing circuit. Current data after A/D conversion may not accurately be added, while analog data before A/D conversion are accurately added. Consequently, charge/discharge currents detected by the battery ECUs in the battery pack systems connected in parallel can be added up to obtain the total charge/discharge current in the battery power source device.

A second aspect of the invention is directed to a battery power source device, comprising a plurality of battery pack systems connected in parallel or series-parallel. The battery pack systems each includes: a battery pack block having a plurality of rechargeable batteries connected in series; a battery ECU for detecting a current, a voltage, and a temperature and for controlling an operation state of the battery pack block based on the detection result; and a charge/discharge circuit for connecting the battery pack block, the circuit including a current sensor. The battery ECU includes an amplification circuit for processing and amplifying a current detection output from the current sensor, and an A/D conversion circuit for receiving and A/D-converting an output value from the amplification circuit for output as a detection value for the current to be used for controlling an operation state of the battery pack system. The power source device further includes an addition unit for adding up the output values of the amplification circuits of the battery ECUs in the battery pack blocks connected in parallel to detect the total charge/discharge current value.

When the output values in the amplification circuits of the battery ECUs in the battery pack systems connected in parallel are added up, the total charge/discharge current in the battery power source device is obtained.

In the above-described configuration, the addition unit collects and adds up the output values of the amplification circuits of the battery ECUs provided at the battery pack systems connected in parallel. The addition unit is provided as an addition circuit at each of the battery ECUs, and an arbitrary one of the battery ECUs serves as a master and the output values of the amplification circuits in the other battery ECUs serving as slaves are input to the addition circuit in the master battery ECU for addition. Thereby, all the battery ECUs can have the same arrangement. In this way, the production management is efficient and the output values are collected to the addition unit in the master battery ECU by the interconnection.

The master battery ECU A/D-converts the total charge/discharge current value produced by the addition by the addition circuit to be used as management data for the operation state. The total charge/discharge current data can be provided to equipment that uses the battery power source device.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

An embodiment of the present invention will now be described in conjunction with the accompanying drawings for the purpose of facilitating the understanding of the present invention.

Figure 1:
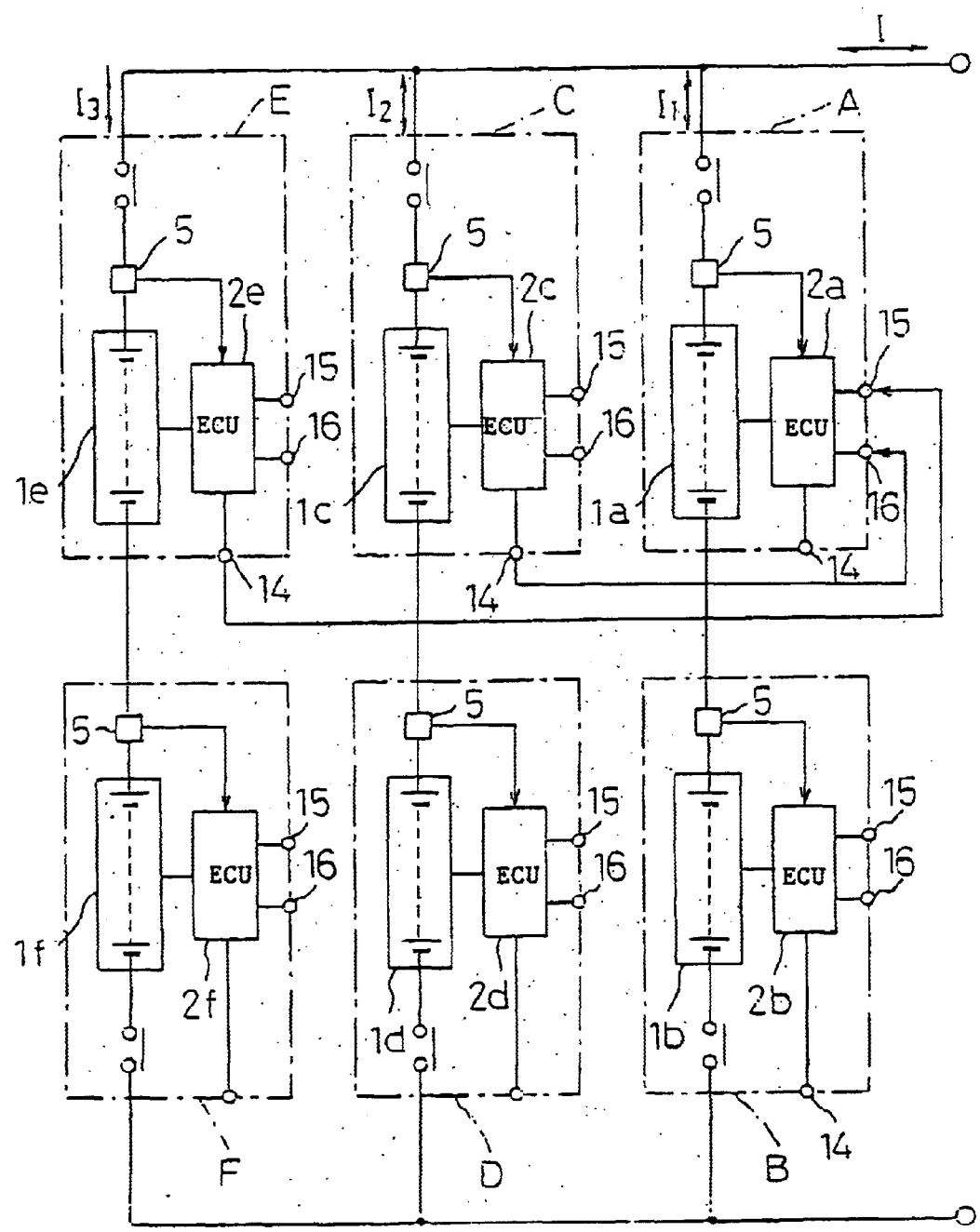
FIG. 1 is a block diagram showing the configuration of a battery power source device according to an embodiment of the invention.

In the embodiment, a battery power source device is applied to a hybrid car, particularly to a large-sized hybrid car using both a motor and an engine. As shown in FIG. 1, in the battery power source device according to the embodiment, battery pack blocks 1a and 1b, 1c and 1d, and 1e and 1f are connected in series, and then the three sets of the series connections are connected in parallel, in other words, the battery pack blocks are connected in series-parallel. In this way, large output voltage and large output current are supplied.

The battery pack blocks 1a to 1f each include 40 battery modules connected in series. The battery modules each include six nickel-metal hydride rechargeable batteries connected in series. The battery pack blocks 1a to 1f each include detectors such as a current sensor, a voltage sensor and a temperature sensor and a cooling fan for cooling the batteries. The battery pack blocks 1a to 1f are connected with battery ECUs 2a to 2f, respectively and in this way, battery pack systems A to F are formed. The battery pack systems A to F all have the same structure, while the interconnection between them is provided so that the battery pack system A serves as a master and the other battery pack systems B to F serve as slaves.

The charge/discharge current and voltage at the battery pack blocks 1a to 1f, voltage and temperature on a battery module basis, and the air temperature (ambient temperature) for cooling the battery pack blocks 1a to 1f are detected by the current sensor, the voltage sensor, and the temperature sensor. In the battery pack systems A to F, the battery ECUs 2a to 2f monitor the operation state of the battery pack blocks 1a to 1f based on these detection outputs. The battery ECUs 2a to 2f control the rotation of the cooling fans, also calculate the SOC, and request the vehicle ECU, the control device of the vehicle to provide charge/discharge to keep the SOC appropriate. The voltage, current, and temperature data and the resultant SOC are output to the vehicle ECU as operation state information.

Figure 2:
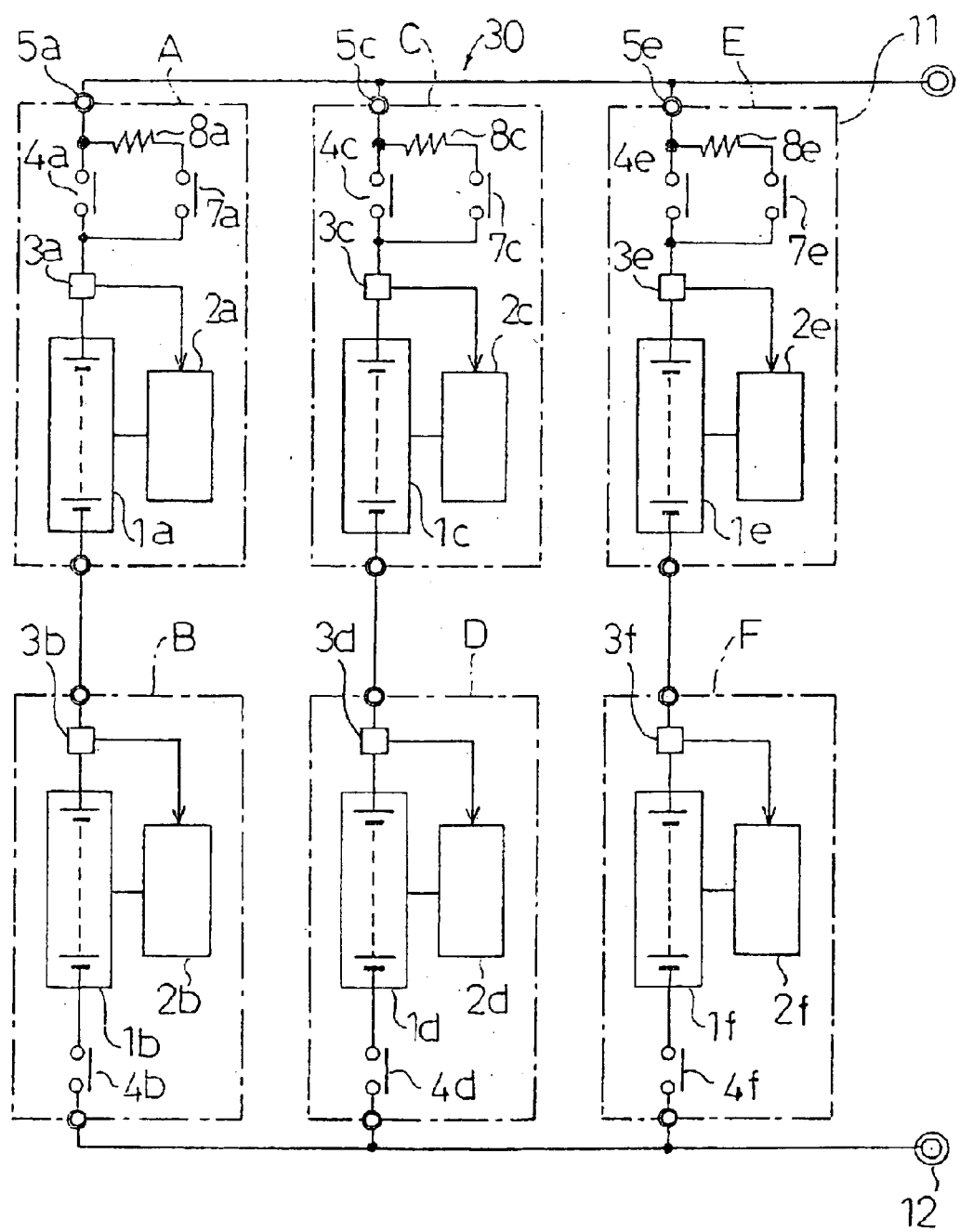
FIG. 2 is a block diagram for use in illustration of how current is detected by the battery ECU according to the embodiment.
Figure 3:
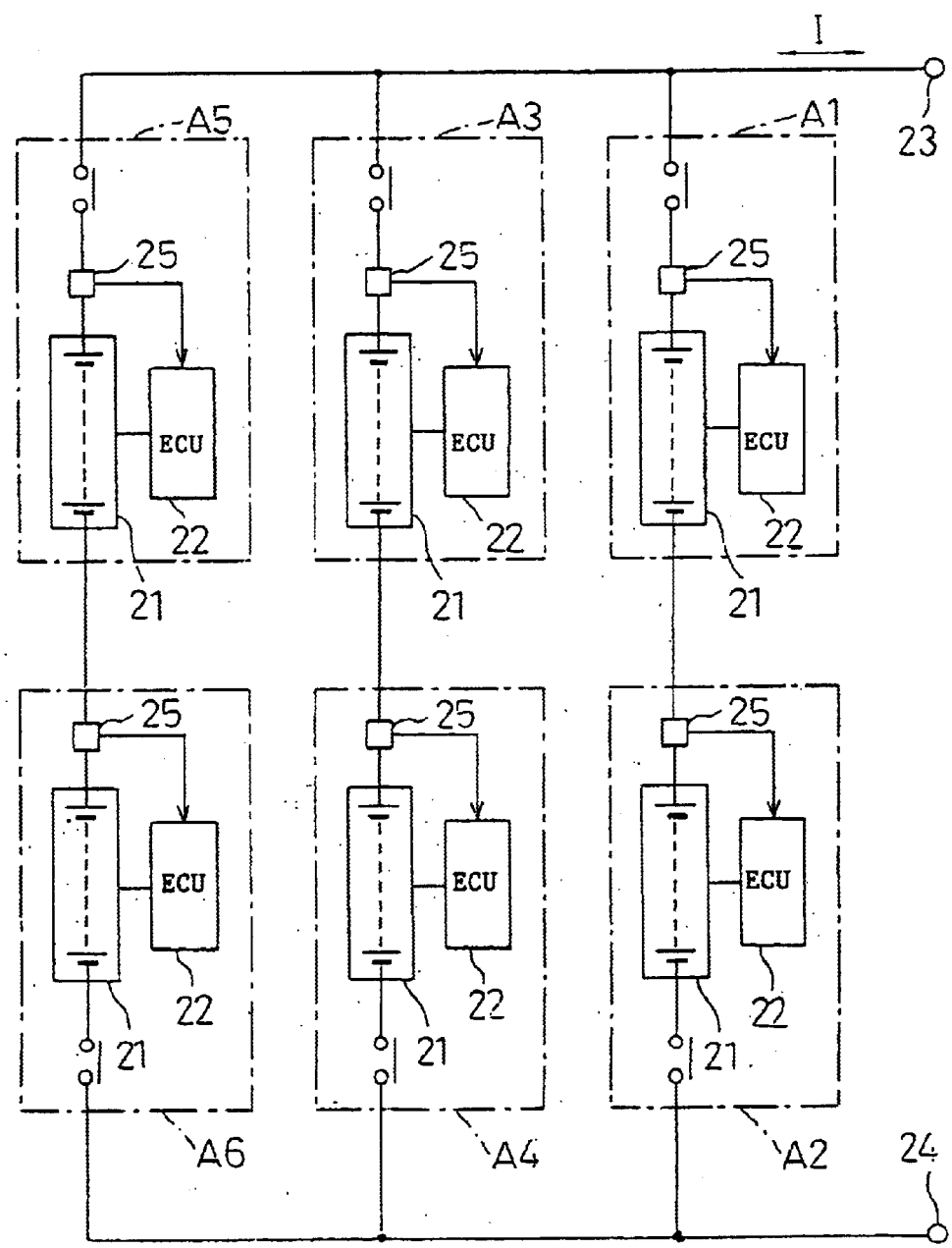
FIG. 3 is a block diagram showing the configuration of a conventional battery power source device.
Figure 4:
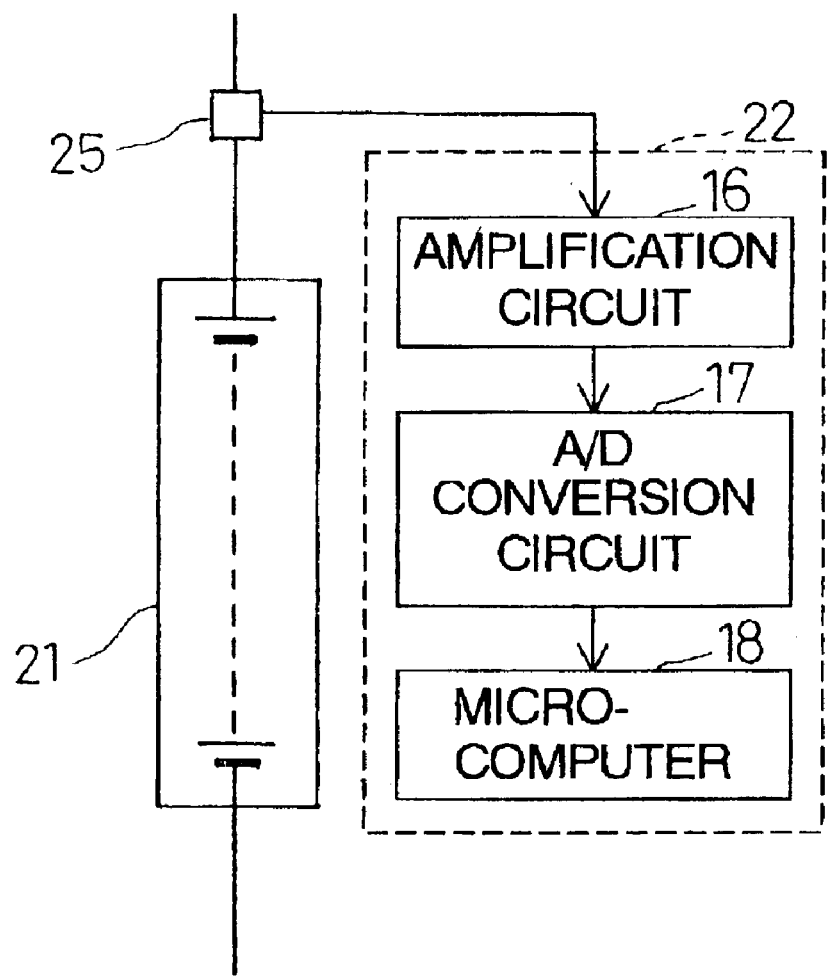
FIG. 4 is a block diagram for use in illustration of how current is detected by the conventional battery ECU.

FIG. 2 is a diagram for use in illustration of how current is detected in the battery ECUs 2a to 2f. Each ECU includes an amplification circuit 7, an A/D conversion circuit 8, an external output terminal 14, and an addition circuit 10. The amplification circuit 7 processes and amplifies a detection output from a current sensor 5 provided at the charge/discharge circuit at each of the battery pack blocks 1a to 1f. The A/D conversion circuit 8 A/D-converts an output from the amplification circuit 7. The external output terminal 14 externally outputs an output from the amplification circuit 7. The addition circuit 10 adds up the output from the amplification circuit 7 and the input from the external input terminals 15 and 16. The digitally converted current data output from the A/D conversion circuit 8 is input to a microcomputer 9, and used for current detection at the battery pack blocks 1a to 1f and calculating the SOC.

The connection to the external output terminal 14 and the external input terminals 15 and 16 is made as shown in FIG. 1. In the battery ECU 2a in the battery pack system A serving as the master, the external output terminal 14 is in an open state with no connection. Meanwhile among the slave battery pack systems B to F, in the battery pack systems C and E connected in parallel with the battery pack system A, the external input terminals 15 and 16 are in an open state with no connection. The external output terminals 14 in the battery pack systems C and E are connected to the external input terminals 15 and 16 in the battery ECU 2a, respectively. The battery pack systems A, C, and E and the battery pack systems B, D, and F connected in series with them have common charge/discharge current, and therefore the addition circuit 10 provided at the battery ECUs 2b, 2d, and 2f in the battery pack systems B, D, and F are not used. The external output terminals 14 and the external input terminals 15 and 16 are kept open.

By this connection arrangement, a current value $I_2$ based on the charge/discharge current detected at the battery pack blocks 1c and 1d by the battery ECU 2c and a current value $I_3$ based on the charge/discharge current detected at the battery pack blocks 1e and 1f by the battery ECU 2e are input to the external input terminals 15 and 16 in the battery ECU 2a from the external output terminals 14. The addition circuit 10 in the battery ECU 2a adds a current value $I_1$ based on the charge/discharge current detected at the battery pack blocks 1a and 1b output from their respective amplification circuits 7, and the current values $I_2$ and $I_3$. The current values $I_1+I_2+I_3$= total charge/discharge current I, and therefore the total charge/discharge current I is obtained without providing an additional current sensor or an associated processing/amplification circuit.

The battery ECUs 2a to 2f all have the same structure, and the interconnection between them enables the total charge/discharge current I to be calculated by the master battery ECU 2a. Thus, when the battery power source device is formed using a plurality of battery pack systems A to F, a prescribed number of battery pack systems having the same structure as described above need only be prepared and appropriately interconnected. The battery ECUs 2a to 2F are compatible, so that the management cost for production management and maintenance service is reduced.

The total charge/discharge current I produced by the addition circuit 10 in the battery ECU 2a as described above can be output as analog data, while the current may be A/D-converted for input to the microcomputer 9, then used as management data or output to the vehicle ECU as digital data.

In the above description, the battery ECUs 2a, 2c, and 2e on the preceding side of the series connection carry out the calculation (addition) for obtaining the total charge/discharge current I, while it is understood that the same result is provided by interconnecting the battery ECUs 2b, 2d, and 2f on the succeeding side for carrying out the addition.

As in the foregoing, according to the invention, without having to provide current detection means, the total charge/discharge current in the battery power source device having a plurality of battery pack blocks connected in parallel or series-parallel is produced by adding up currents at the charge/discharge circuits at the battery pack blocks connected in parallel.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A method for detecting a total charge/discharge current in a battery power source device, said battery power source device including a plurality of battery pack systems connected in parallel or series-parallel, said battery pack systems each including a battery pack block having a plurality of rechargeable batteries connected in series, a battery ECU for detecting a current, a voltage, and a temperature and for controlling an operation state of the battery pack block based on the detection result, and a charge/discharge circuit for connecting the battery pack block, the method comprising:

detecting currents at the respective charge/discharge circuits of the battery pack systems detected by said corresponding battery ECUs provided at the battery pack system connected in parallel; and adding up the currents in an analog data state to detect the total charge/discharge current.

2. A battery power source device, comprising a plurality of battery pack systems connected in parallel or series-parallel, said battery pack systems each including:

a battery pack block having a plurality of rechargeable batteries connected in series, a battery ECU for detecting a current, a voltage, and a temperature and for controlling an operation state of the battery pack block based on the detection result, and a charge/discharge circuit for connecting the battery pack block, the circuit including a current sensor, said battery ECU including an amplification circuit for processing and amplifying a current detection output from the current sensor, and an A/D conversion circuit for receiving and A/D-converting an output value from the amplification circuit for output as a detection value for said current to be used for controlling an operation state of the battery pack system, wherein said power source device further comprises an addition unit for adding up the output values of said amplification circuits of the battery ECUs in the battery pack blocks connected in parallel to detect the total charge/discharge current value.

3. The battery power source device according to claim 2, wherein the addition unit collects and adds up the output values of the amplification circuits of the battery ECUs provided at the battery pack systems connected in parallel.

4. The battery power source device according to claim 2, wherein the addition unit is an addition circuit provided at each of said battery ECUs, and an arbitrary one of the battery ECUs serves as a master and the output values of the amplification circuits in the other battery ECUs serving as slaves are input to the addition circuit in the master battery ECU for addition.

5. The battery power source device according to claim 4, wherein the master battery ECU A/D-converts the total charge/discharge current value produced by the addition by the addition circuit to be used as management data for the operation state.

* * * * *

UNITED STATES PATENT AND TRADEMARK OFFICE
CERTIFICATE OF CORRECTION

PATENT NO. : 6,762,590 B2
DATED : July 13, 2004
INVENTOR(S) : H. Yudahira et al.

It is certified that error appears in the above-identified patent and that said Letters Patent is hereby corrected as shown below:

Column 6,
Line 58, delete "by the addition" (first occurrence).

Signed and Sealed this

Eighth Day of March, 2005

JON W. DUDAS
*Director of the United States Patent and Trademark Office*